United States Patent
Ochiai

(10) Patent No.: US 7,504,722 B2
(45) Date of Patent: Mar. 17, 2009

(54) SEMICONDUCTOR DEVICE WITH SLANTING SIDE SURFACE FOR EXTERNAL CONNECTION

(75) Inventor: Isao Ochiai, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 92 days.

(21) Appl. No.: 11/135,668

(22) Filed: May 24, 2005

(65) Prior Publication Data

US 2005/0269696 A1    Dec. 8, 2005

(30) Foreign Application Priority Data

May 24, 2004    (JP)    ............................. 2004-152736

(51) Int. Cl.
*H01L 23/04*    (2006.01)
(52) U.S. Cl. ...................... 257/730; 257/620; 257/698; 257/E23.003; 438/110; 438/113; 438/460; 438/613
(58) Field of Classification Search .................. 438/460, 438/613; 257/E23.001, E23.003, 620, 734, 257/698, 730
See application file for complete search history.

(56) References Cited

U.S. PATENT DOCUMENTS

| | | | | |
|---|---|---|---|---|
| 4,862,247 | A * | 8/1989 | Derryberry et al. .......... | 257/693 |
| 5,901,046 | A * | 5/1999 | Ohta et al. ................... | 361/760 |
| 5,969,461 | A * | 10/1999 | Anderson et al. ....... | 310/313 R |
| 5,973,396 | A * | 10/1999 | Farnworth ................... | 257/698 |
| 6,235,554 | B1 * | 5/2001 | Akram et al. ................ | 438/109 |
| 6,406,942 | B2 | 6/2002 | Honda | |
| 6,455,920 | B2 | 9/2002 | Fukawaswa et al. | |
| 6,552,529 | B1 * | 4/2003 | Fasano et al. ............. | 324/158.1 |
| 6,861,757 | B2 * | 3/2005 | Shimoto et al. ............. | 257/773 |
| 2001/0053567 | A1 * | 12/2001 | Akram et al. ................ | 438/127 |
| 2002/0063332 | A1 * | 5/2002 | Yamaguchi et al. ......... | 257/738 |
| 2003/0230805 | A1 * | 12/2003 | Noma et al. ................. | 257/737 |
| 2004/0137701 | A1 * | 7/2004 | Takao .......................... | 438/461 |
| 2004/0178495 | A1 * | 9/2004 | Yean et al. ................... | 257/723 |
| 2005/0003649 | A1 * | 1/2005 | Takao .......................... | 438/612 |

(Continued)

FOREIGN PATENT DOCUMENTS

JP    10-173324 A    6/1998

(Continued)

*Primary Examiner*—Davienne Monbleau
*Assistant Examiner*—Christopher M Roland
(74) *Attorney, Agent, or Firm*—Morrison & Foerster LLP

(57)    ABSTRACT

The invention provides a semiconductor device and a manufacturing method thereof where mounting strength and accuracy can be improved without making processes complex. Grooves are formed on a back surface of a semiconductor substrate along a dicing line. Via holes are formed penetrating the semiconductor substrate from its back surface to pad electrodes. Embedded electrodes are then formed in the via holes, and a wiring layer connected with the embedded electrodes is formed extending to a region near a dicing line. Conductive terminals are formed at end portions of the wiring layer. Then, dicing is performed along the dicing line to complete the semiconductor device having inclined surfaces at end portions of its back surface. When the semiconductor device is connected with the circuit board by a reflow process, conductive paste having increased fluidity covers the conductive terminals and the inclined surfaces. The conductive paste having side fillets are formed on the circuit board around an outer edge of the semiconductor device.

9 Claims, 3 Drawing Sheets

U.S. PATENT DOCUMENTS

| | | | |
|---|---|---|---|
| 2005/0194670 A1 * | 9/2005 | Kameyama et al. | 257/678 |
| 2005/0202651 A1 * | 9/2005 | Akram | 438/463 |
| 2005/0248030 A1 * | 11/2005 | Ochiai | 257/734 |

FOREIGN PATENT DOCUMENTS

| | | | |
|---|---|---|---|
| JP | 11-251493 A | | 9/1999 |
| JP | 2001-257288 A | | 9/2001 |
| JP | 2003007909 A | * | 1/2003 |
| JP | 2003-229518 | | 8/2003 |
| JP | 2003-309221 | | 10/2003 |
| WO | WO 99/40624 | | 8/1999 |

* cited by examiner

SEMICONDUCTOR DEVICE WITH SLANTING SIDE SURFACE FOR EXTERNAL CONNECTION

CROSS-REFERENCE OF THE INVENTION

This invention is based on Japanese Patent Application No. 2004-152736, the content of which is incorporated by reference in its entirety.

BACKGROUND OF THE INVENTION

1. Field of the Invention

The invention relates to a semiconductor device and a manufacturing method thereof, particularly to a package type semiconductor device and a manufacturing method thereof.

2. Description of the Related Art

A CSP (Chip Size Package) has been gathering attention as a package type semiconductor device. The CSP means a small package having almost the same outside dimensions as those of a semiconductor die packaged in it.

Conventionally, BGA (Ball Grid Array) type semiconductor device have been known as a kind of CSP. In such a BGA type semiconductor device, a plurality of ball-shaped conductive terminals made of metal such as solder is arrayed in a grid pattern on one surface of the package, and electrically connected with the semiconductor die mounted on the other side of the package. The BGA type semiconductor device of the conventional art will be described with reference to drawings.

FIG. 9 is a cross-sectional view for explaining the semiconductor device of the conventional art. As shown in FIG. 9, pad electrodes 61 are formed on a front surface of a semiconductor die 60A of a semiconductor device 2. Furthermore, the front surface of the semiconductor die 60A is covered with a sealing member 63. Via holes are formed in the semiconductor die 60A, penetrating the semiconductor die 60A from its back surface to the pad electrodes 61. Embedded electrodes 68 are formed in the via holes, being connected with the pad electrodes 61. Ball-shaped conductive terminals 71 are formed on the embedded electrodes 68 exposed at the via holes on the back surface of the semiconductor die 60A.

The semiconductor device 2 is mounted on a circuit board 80 formed with a conductive pattern (not shown) so that the circuit board 80 and the back surface of the semiconductor die 60A face to each other. Conductive paste 90 made of, for example, solder is formed by printing on a surface of the circuit board 80 formed with the conductive pattern (not shown), in regions to be connected with the conductive terminals 71. Furthermore, a so-called under filler 91 for preventing a vacant space from forming between the back surface of the semiconductor die 60A and the circuit board 80 is formed on the surface of the circuit board 80, in a region where the conductive paste 90 is not formed.

The conductive paste 90 increases its fluidity by a reflow process and partially covers the conductive terminals 71. This makes the conductive terminals 71 electrically connected with the conductive pattern (not shown) of the circuit board 80 and fixed to the circuit board 80.

The relevant technology is disclosed in the Japanese Patent Application Publication Nos. 2003-309221, 2002-512436 and 2003-229518.

However, there has been a problem that adhesion failure occurs when the described semiconductor device 2 of the conventional art and the circuit board 80 are connected to each other with the conductive paste 90. This is because that the amount of the conductive paste 90 formed on the circuit board 80 is limited and sometimes the conductive paste 90 does not properly extend to both the conductive terminals 71 and the conductive pattern (not shown) of the circuit board 80 in the reflow process. Furthermore, when the amount of the conductive paste 90 is increased for solving the adhesion failure, there arises a problem that the adjacent conductive terminals 71 are short-circuited in the reflow process because of excess conductive paste. Furthermore, it has been difficult to check whether the semiconductor device 2 and the circuit board 80 are properly connected with each other.

Furthermore, even if the semiconductor device 2 and the circuit board 80 are properly connected to each other with the conductive paste 90, mechanical strength of the connection is not enough because of the small amount of conductive paste. For solving this, a so-called under filler made of an epoxy resin is formed between the semiconductor die 60A and the circuit board 80 to prevent the short-circuit between the conductive terminals 71 and increase the mechanical strength. Since the formation of the under filler is generally performed by a user of the semiconductor device, there has been a problem that the mounting processes performed by the user increases.

As a result, the mounting processes to be performed by the user of the semiconductor device become complex, and the mounting accuracy lowers.

SUMMARY OF THE INVENTION

The invention provides a semiconductor device assembly that includes a semiconductor die having a slant surface slanting from a back surface of the semiconductor die and connecting the back surface and a side surface of the semiconductor die, a pad electrode formed on a front surface of the semiconductor die, an embedded electrode that is disposed in a via hole formed in the semiconductor die and is in contact with the pad electrode, a wiring layer that is in contact with the embedded electrode and covers the slant surface, and a circuit board on which the semiconductor die is mounted so that the back surface of the semiconductor die faces the circuit board.

The invention also provides a method of manufacturing a semiconductor device. The method includes providing a semiconductor substrate having a pad electrode on a front surface thereof, and forming a groove in the semiconductor substrate along a dicing line on a back surface of the semiconductor substrate. The side surface of the groove slants from the back surface of the semiconductor substrate. The method also includes forming a via hole from the back surface of the semiconductor substrate so as to expose the surface of the pad electrode, forming an insulating film to cover the back surface of the semiconductor substrate, the side surface of the groove and a side wall of the via hole, forming an embedded electrode that is disposed in the via hole and in contact with the pad electrode, forming a wiring layer that is connected with the embedded electrode and covers the side surface of the groove, and cutting the semiconductor substrate through the dicing line so that a semiconductor die comprising the pad electrode is formed.

In this invention, when the semiconductor device is mounted on the circuit board, the conductive paste of which the fluidity is increased by the reflow process flows toward the front surface of the semiconductor die along the slant surfaces and toward the outside of the semiconductor die along the circuit board by its surface tension on the slant surfaces formed on the back surface of the semiconductor device. Accordingly, not only the conductive terminals but also the slant surfaces are covered with the conductive paste. This can minimize adhesion failure between the conductive terminals and the circuit board as has been seen in the conventional art. This can also improve the mechanical strength of the connection between the semiconductor device and the circuit board.

Furthermore, when the connection is made properly, the conductive paste (a so-called side fillet) overflowing from the side surface of the semiconductor device can be seen from the front surface of the semiconductor device. Therefore, the user of the semiconductor device who performs the connection process can determine whether the connection is made properly by checking the formation of the side fillet.

Furthermore, the conductive paste is tend to flow toward the outside of the semiconductor device along the circuit board by its surface tension on the slant surfaces. Therefore, even when a larger amount of the conductive paste than conventional is formed on the circuit board, a space between the adjacent conductive terminals can be prevented from being filled with the conductive paste. That is, a short-circuit between the conductive terminals can be minimized.

Furthermore, since the mechanical strength of the connection between the semiconductor device and the circuit board can be improved and the short circuit between the conductive terminals can be minimized, a process of forming an under filler as has been performed by the user of the semiconductor device in the conventional art can be omitted.

As a result, the mounting strength and accuracy can be improved without making the processes complex.

DETAILED DESCRIPTION OF THE INVENTION

Figure 5:
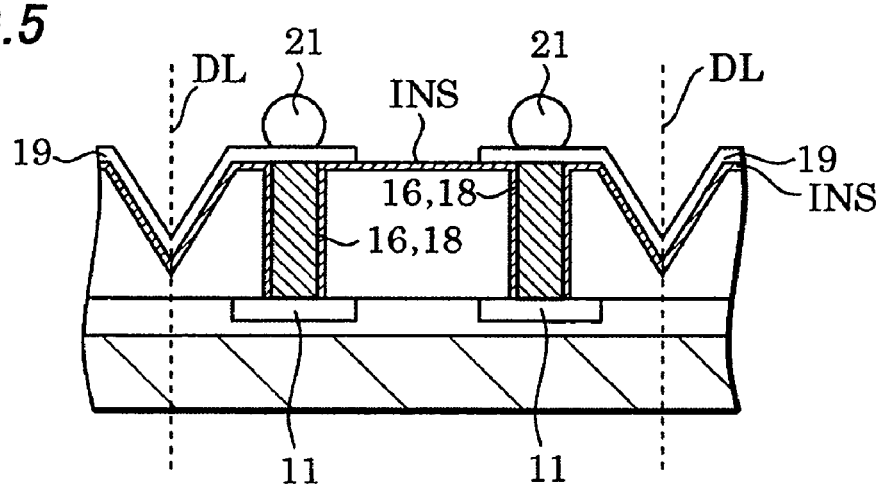
FIG. 5 is a cross-sectional view showing the manufacturing method of the semiconductor device of the embodiment of the invention.
Figure 6:
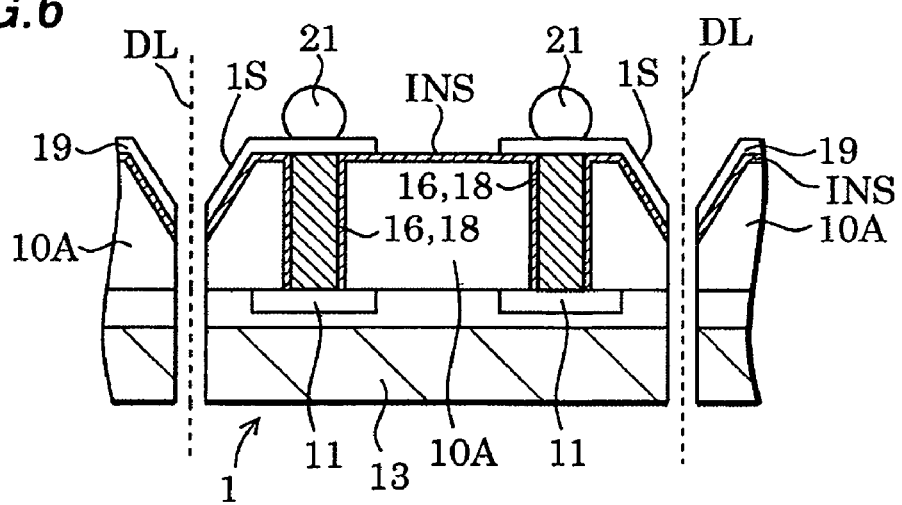
FIG. 6 is a cross-sectional view showing the semiconductor device and the manufacturing method thereof of the embodiment of the invention.

Next, a manufacturing method of a semiconductor device of an embodiment of the invention will be described with reference to drawings in detail. FIGS. 1 to 5 are cross-sectional views showing the manufacturing method of the semiconductor device of the embodiment. FIG. 6 is a cross-sectional view showing the semiconductor device and the manufacturing method thereof of the embodiment. It is noted that FIGS. 1 to 6 show a semiconductor substrate forming the semiconductor device in a region near dicing lines.

Figure 1:
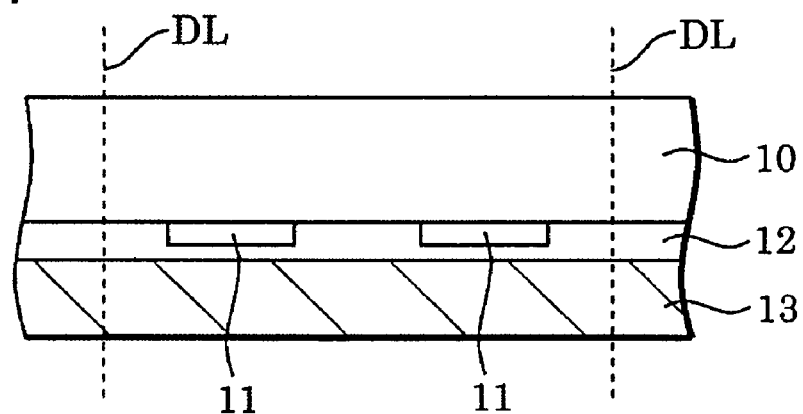
FIG. 1 is a cross-sectional view showing a manufacturing method of a semiconductor device of an embodiment of the invention.

First, a semiconductor substrate 10 formed with electronic devices (not shown) is prepared as shown in FIG. 1. The electronic devices (not shown) are formed on a first surface, i.e., a front surface of the semiconductor substrate 10. Pad electrodes 11 are formed on the front surface of the semiconductor substrate 10 with an insulating film (not shown) therebetween, extending from the electronic devices (not shown). The number of the pad electrodes 11 is not limited to the number (two) shown in FIG. 2. Furthermore, a passivation film (not shown) formed of a silicon oxide film or a silicon nitride film is formed on the semiconductor substrate 10, exposing a part of the pad electrodes 11.

A resin layer 12 made of, for example, an epoxy resin is formed on the front surface of the semiconductor substrate 10 to cover the electronic devices and the pad electrodes 11. Furthermore, a supporting member 13 is attached to the front surface of the semiconductor substrate 10 with the resin layer 12. When the electronic devices (not shown) formed on the front surface are light receiving elements, a substrate, a resin, or a tape made of a transparent or semitransparent material is used as the supporting member 13. When the electronic devices (not shown) are not the light receiving elements, the material of the supporting member 13 is not limited to the transparent or semitransparent material. It is noted that the supporting member 13 can be omitted according to the use of the electronic devices (not shown) or the semiconductor device.

Next, a back surface of the semiconductor substrate 10 is ground to have a predetermined thickness according to need. That is, back-grinding is performed. The back surface can be further etched to remove a mechanical damage layer occurred by back-grinding.

Figure 2:
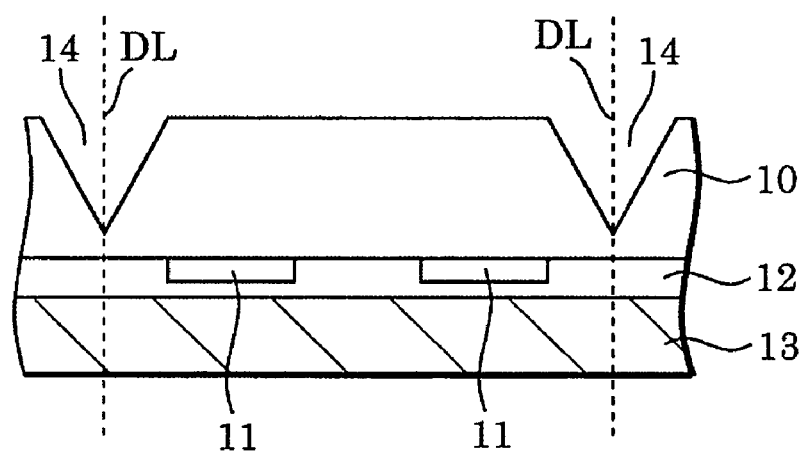
FIG. 2 is a cross-sectional view showing the manufacturing method of the semiconductor device of the embodiment of the invention.

Next, grooves 14 are formed on the back surface of the semiconductor substrate 10 along the dicing lines DL, as shown in FIG. 2. These grooves 14 are formed by cutting using a dicing blade, for example. Each of the grooves 14 has inclined surfaces, i.e., slant surfaces, inclining at a predetermined angle from the back surface of the semiconductor substrate 10. Each of the inclined surfaces is formed from the back surface of the semiconductor substrate 10 toward the front surface thereof so as to converge on the dicing line DL.

Figure 3:
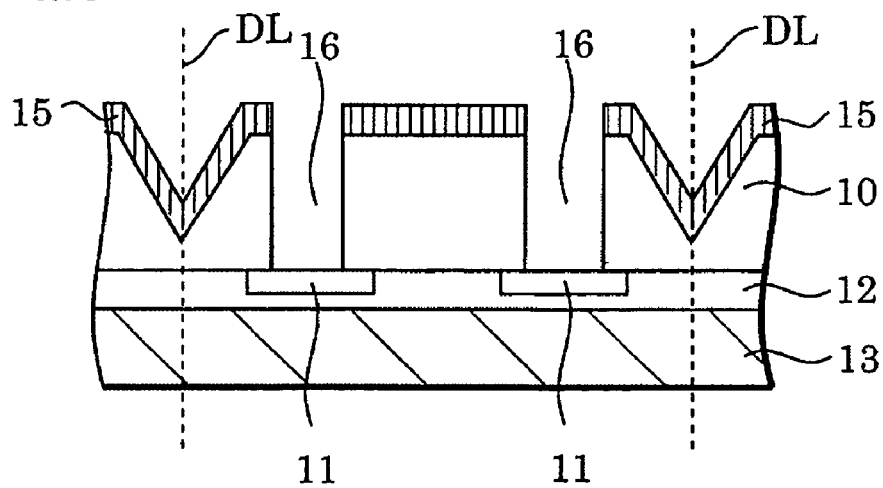
FIG. 3 is a cross-sectional view showing the manufacturing method of the semiconductor device of the embodiment of the invention.

Next, a first resist layer 15 is selectively formed on the back surface of the semiconductor substrate 10, as shown in FIG. 3. That is, the first resist layer 15 is formed having openings in predetermined positions corresponding to the pad electrodes 11. Then, etching is performed to the semiconductor substrate 10 and the insulating film (not shown) using the first resist layer 15 as a mask to form via holes 16 extending from the back surface of the semiconductor substrate 10 to the pad electrodes 11. Then, the first resist layer 15 is removed.

The via holes 16 shown in FIG. 3 are formed straight, but any shape can be formed by adjusting an etching condition. Furthermore, the grooves 14 can be formed together with the via holes 16 by the etching process performed when the via holes 16 are formed. In this case, the etching condition need be adjusted so as to form the grooves 14 having the inclined surfaces inclining at a predetermined angle. In this process, the via holes 16 formed at the same time by the etching process are formed in tapered shapes.

Alternatively, the via holes 16 are not necessarily formed after the formation of the grooves 14, and can be formed before the formation of the grooves 14. However, in this case, there is a possibility that the bottoms of the via holes 16 can be contaminated by cutting dust in the cutting process for forming the grooves 14.

Figure 4:
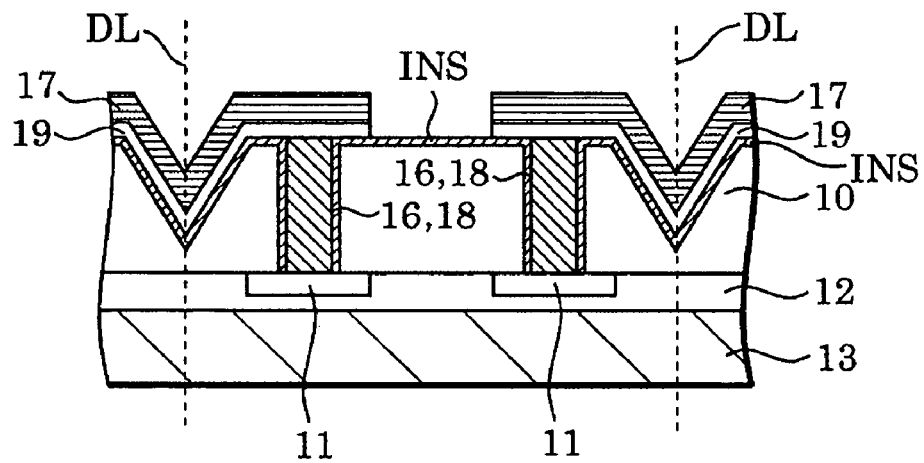
FIG. 4 is a cross-sectional view showing the manufacturing method of the semiconductor device of the embodiment of the invention.

Next, an insulating film INS formed of, for example, a silicon oxide film or a silicon nitride film is formed on the back surface of the semiconductor substrate 10 including inside the via holes 16, as shown in FIG. 4. When the insulating film INS on the bottoms of the via holes 16 is thinner than in the other region, the insulating film INS is etched for the whole surface from the back surface of the semiconductor substrate 10 to remove the insulating film INS on the bottoms of the via holes 16. Alternatively, only the insulating film INS on the bottoms of the via holes 16 is etched and removed using a resist layer (not shown) as a mask, the resist layer having openings corresponding to the via holes 16. It is noted that the insulating film INS can be formed only on sidewalls of the via holes 16, as a sidewall insulating film.

Next, embedded electrodes 18 made of, for example, copper (Cu) and a wiring layer 19 connected with the embedded electrodes 18 are formed on the back surface of the semiconductor substrate 10 (i.e. on the insulating film INS) including in the via holes 16 by plating or sputtering. Furthermore, a second resist layer 17 is formed on the wiring layer 19 in a region to be left. The region to be left of the wiring layer 19 is a region extending from on the embedded electrodes 18 to the inclined surfaces in the grooves 14 (i.e. region from on the embedded electrodes 18 to the dicing lines DL in the grooves 14 or near the dicing lines DL). Then, the wiring layer 19 is etched with using the second resist layer 17 as a mask. By this process, the wiring layer 19 is electrically connected with the pad electrodes 11 and the embedded electrodes 18 and patterned to extend over the inclined surfaces of the grooves 14.

It is noted that the embedded electrodes 18 or the wiring layer 19 are not necessarily made of copper (Cu), and can be formed of a metal other than copper (Cu) such as aluminum (Al) or aluminum alloy as long as these can be formed by plating or sputtering. Furthermore, the embedded electrodes 18 and the wiring layer 19 can be formed in different processes respectively or formed of the same layer in the same process.

Next, after the second resist layer 17 is removed, conductive terminals 21 are formed on the wiring layer 19 in predetermined positions. The predetermined positions to be formed with the conductive terminals 21 can lie in positions corresponding to the embedded electrodes 18 (not shown) as shown in FIG. 5 or in other positions. The conductive terminals 21 are formed of, for example, solder by printing or a reflow process.

As a modification, it is noted that the wiring layer 19 can be omitted when the pad electrodes 11 and the embedded electrodes 18 are formed near the dicing lines DL of the semiconductor substrate. Although the conductive paste 40a does not cover the inclined surfaces in this modification, the conductive paste 40a can be easily seen from the inclined surfaces. Therefore, a user of the semiconductor device who performs the connection process can determine whether the connection is made properly by checking the formation of this side fillet.

Next, as shown in FIG. 6, the semiconductor substrate 10 and other layers are separated by dicing along the dicing lines DL, and the semiconductor devices 1 each formed of the semiconductor die 10A and the other layers are completed. On the back side of the semiconductor device 1, inclined surfaces 1S inclining from the end portion of the back surface of the semiconductor die 10A to the side surface thereof are formed.

Figure 7:
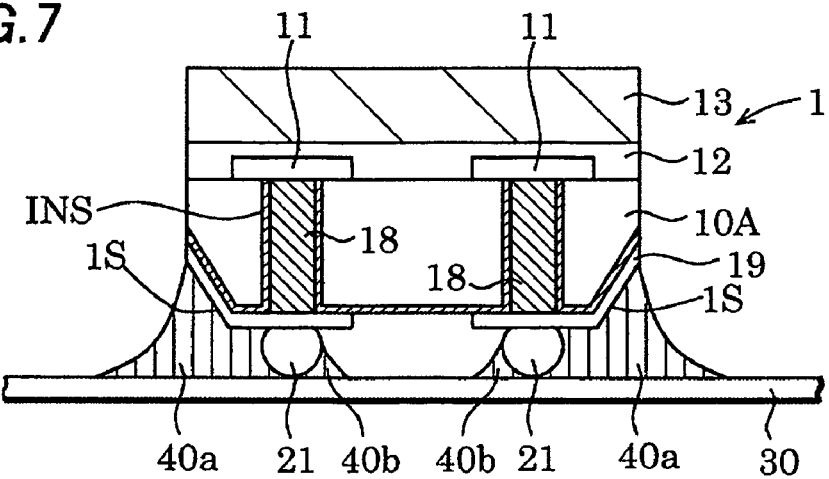
FIG. 7 is a cross-sectional view for explaining the semiconductor device of the embodiment of the invention.

Next, the case of mounting the described semiconductor device 1 on the circuit board will be described with reference to drawings. FIG. 7 is a cross-sectional view explaining the semiconductor device of the embodiment of the invention. FIG. 7 shows a cross-sectional view of the semiconductor device 1 and the circuit board 30 such as a printed board when the device 1 is mounted on and connected with the circuit board 30. The conductive pattern (not shown) is formed on the circuit board 30.

As shown in FIG. 7, the semiconductor device 1 is mounted on the circuit board 30 so that the back surface (i.e. surface formed with the conductive terminals 21) of the semiconductor device 1 faces to the front surface of the circuit board 30 (i.e. a surface formed with the conductive pattern (not shown)).

Conductive paste or a conductive wax member (will be mentioned as conductive paste 40a and 40b after the reflow process described below) made of, for example, solder or silver (Ag) is formed by printing on the front surface of the circuit board 30 in regions to be connected with the conductive terminals 21.

Then, for connecting the semiconductor device 1 and the circuit board 30 with the conductive paste, the reflow process (i.e., a heating process) is performed. The conductive paste 40a and 40b of which the fluidity increases by the reflow process flows toward the front surface of the semiconductor device 1 along the inclined surfaces 1S and toward the outside of the semiconductor device 1 in a horizontal direction of the circuit board 30 by its surface tension at the inclined surfaces 1S formed on the back surface of the semiconductor device 1 (i.e. at the inclined surfaces 1S formed with the wiring layer 19). Accordingly, not only the conductive terminals 21 but also the inclined surfaces 1S are covered with the conductive paste 40a and 40b. This can minimize adhesion failure between the conductive terminals and the circuit board as has been seen in the conventional art. This can also improve mechanical strength of the connection between the semiconductor device and the circuit board.

Furthermore, when the connection is made properly, the conductive paste 40a, that is, a so-called side fillet overflowing from the side surface of the semiconductor device 1 can be seen from the front surface of the semiconductor device 1. Therefore, a user of the semiconductor device 1 who performs the connection process can determine whether the connection is made properly by checking the formation of this side fillet.

Furthermore, the conductive paste 40a and 40b tends to flow toward the outside of the semiconductor device 1 along the circuit board 30 by its surface tension at the inclined surfaces 1S. Therefore, even when a larger amount of conductive paste than conventional is formed on the circuit board 30, a space between the adjacent conductive terminals 21 can be prevented from being filled with the conductive paste 40b. That is, a short-circuit between the conductive terminals 21 can be minimized.

Furthermore, since the mechanical strength of the connection between the semiconductor device 1 and the circuit board 30 is improved and the short-circuit between the conductive terminals 21 can be minimized, a process of forming an under filler 91 as has been performed by the user of the semiconductor device 1 in the conventional art can be omitted.

As a result, the mounting strength and accuracy of the semiconductor device 1 can be improved without making the processes complex.

Furthermore, in the semiconductor device 1 shown in FIG. 7, a protection layer (not shown) can be formed on the back surface of the semiconductor die 10A excluding its end portion so as to cover the back surface and the wiring layer 19. In this case, the reliability of the semiconductor device 1 can be further improved.

Figure 8:
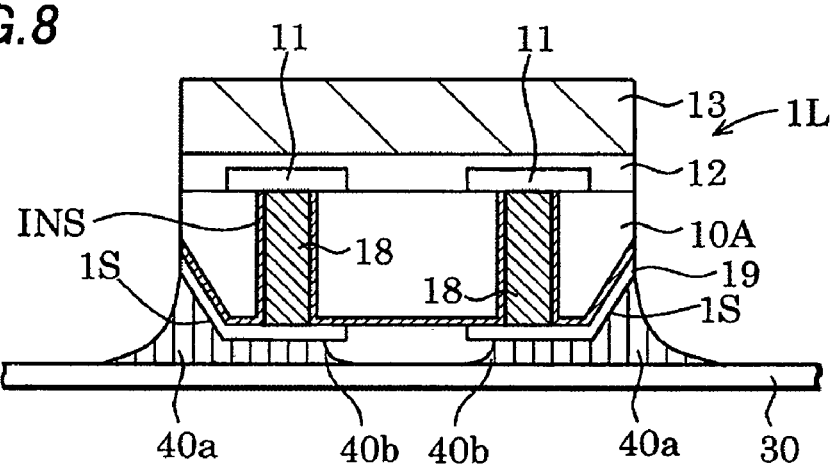
FIG. 8 is a cross-sectional view for explaining the semiconductor device of the embodiment of the invention.
Figure 9:
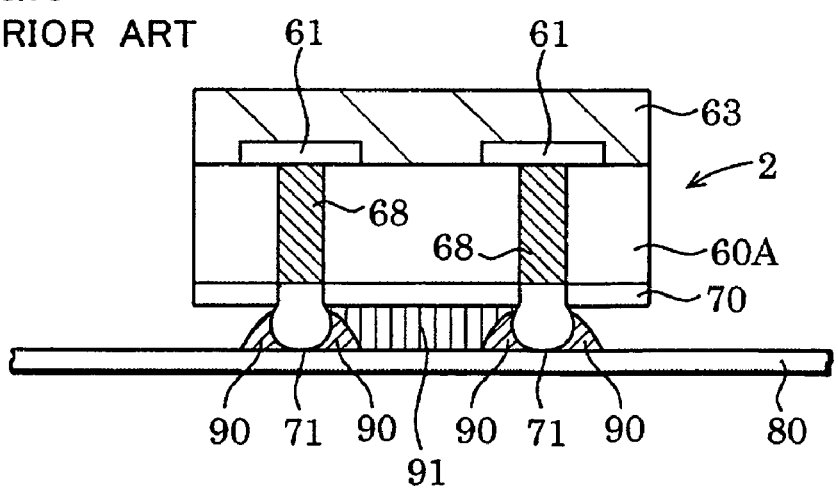
FIG. 9 is a cross-sectional view for explaining a semiconductor device of a conventional art.

Although the conductive terminals 21 are formed on the back surface of the semiconductor die 10A in the described embodiment, the invention is not limited to this. That is, the invention can be applied to a semiconductor device having no conductive terminals 21 as long as the semiconductor device is formed with the embedded electrodes 18 penetrating the semiconductor die and the wiring layer 19 connected with the embedded electrodes 18 and extending over the inclined surfaces 1S. In this case, as shown in FIG. 8 for example, the conductive paste 40a and 40b having the same side fillet as in FIG. 7 is formed on the wiring layer 19 having no conductive terminal so as to cover the embedded electrodes 18 and the inclined surfaces 1S at the end portion of the semiconductor die 10A of the semiconductor device 1L.

What is claimed is:

1. A semiconductor device comprising:
   a semiconductor die comprising a slant surface slanting from a back surface of the semiconductor die and connecting the back surface and an outside side surface of the semiconductor die;
   a pad electrode formed on a front surface of the semiconductor die;
   an embedded electrode that is disposed in a via hole formed in the semiconductor die and is in contact with the pad electrode;
   a wiring layer that is in contact with the embedded electrode and covers the slant surface;
   a circuit board on which the semiconductor die is mounted so that the back surface of the semiconductor die faces the circuit board; and
   a conductive fillet connecting the slant surface of the semiconductor die and the circuit board,
   wherein the pad electrode covers the via hole formed in the semiconductor die, and the conductive fillet extends away from the embedded electrode and beyond a contour of the semiconductor die defined by the outside side surface.

2. The semiconductor device of claim 1, wherein the embedded electrode and the wiring layer are continuous such that the embedded electrode and the wiring layer are formed by a single deposition step.

3. The semiconductor device of claim 2, further comprising a conductive terminal disposed on the wiring layer.

4. The semiconductor device of claim 3, wherein the conductive fillet connects the slant surface of the semiconductor die, the conductive terminal and the circuit board.

5. The semiconductor device of claim 1, further comprising a conductive bump terminal disposed on the wiring layer.

6. The semiconductor device of claim 5, wherein the conductive fillet connects the slant surface of the semiconductor die, the conductive bump terminal and the circuit board.

7. The semiconductor device of claim 1, further comprising a supporting member attached to the front surface of the semiconductor die.

8. The semiconductor device of claim 1, wherein the conductive fillet does not cover the outside side surface.

9. The semiconductor device of claim 1, wherein the wiring layer covers the slant surface so as to reach the outside side surface, and the conductive fillet covers the wiring layer so as to reach the outside side surface.

* * * * *